United States Patent [19]
Funaki et al.

[11] Patent Number: 5,561,386
[45] Date of Patent: Oct. 1, 1996

[54] CHIP TESTER WITH IMPROVEMENTS IN HANDLING EFFICIENCY AND MEASUREMENT PRECISION

[75] Inventors: Shoichi Funaki; Shoichi Teshirogi, both of Kawasaki, Japan

[73] Assignee: Fujitsu Limited, Kanagawa, Japan

[21] Appl. No.: 387,469

[22] Filed: Feb. 13, 1995

[30] Foreign Application Priority Data

Feb. 23, 1994 [JP] Japan .................................. 6-024573
Apr. 15, 1994 [JP] Japan .................................. 6-077210

[51] Int. Cl.⁶ ................................................ G01R 31/02
[52] U.S. Cl. ........................ 324/758; 324/754; 324/765
[58] Field of Search ................................. 324/758, 754, 324/765; 74/89.15; 348/87

[56] References Cited

U.S. PATENT DOCUMENTS

| | | | |
|---|---|---|---|
| 4,589,815 | 5/1986 | Smith ...................... | 324/758 |
| 4,893,074 | 1/1990 | Holt et al. ................ | 324/758 |
| 5,030,869 | 7/1991 | Holt et al. ................ | 324/758 |
| 5,087,878 | 2/1992 | Belmore, III et al. .... | 324/754 |
| 5,321,351 | 6/1994 | Swart et al. .............. | 324/758 |
| 5,374,888 | 12/1994 | Karasawa ................ | 324/765 |
| 5,410,259 | 4/1995 | Fujihara et al. .......... | 324/758 |
| 5,440,943 | 8/1995 | Holt et al. ................ | 74/89.15 |
| 5,450,017 | 9/1995 | Swart ....................... | 324/754 |

*Primary Examiner*—Kenneth A. Wieder
*Assistant Examiner*—Keuresh Cyrus Khosravi
*Attorney, Agent, or Firm*—Nikaido Marmelstein Murray & Oram LLP

[57] ABSTRACT

A chip tester comprises a stage which is attached to an end of an arm and on which a chip is disposed, a reversing mechanism which rotates the arm from a first position to a second position and reverses a surface of the stage so as to look from upward to downward and vice versa, a vertical drive mechanism which moves the reversing mechanism vertically, and a probe head having pin-electrodes arranged under the second position of said arm as to face pad-electrodes of the chip looking downward. The chip tester further comprises an auxiliary system for assisting alignment of the chip with the probe head, the auxiliary system comprising an image pickup device arranged above the stage at the first position for picking up an image of the chip surface, and a monitor and a controller, these being operatively coupled with each other. The chip tester still further comprises improvement in a chip guide for easy and precise positioning of the chip onto the stage, and improvement in the prove head for enhancing precision of a high frequency test for the chip.

14 Claims, 9 Drawing Sheets

CHIP TESTER WITH IMPROVEMENTS IN HANDLING EFFICIENCY AND MEASUREMENT PRECISION

BACKGROUND OF THE INVENTION

1. Field of the Invention

The present invention relates to a chip tester used for electrically testing electronic chip parts such as semiconductor bare chips before packaging them into devices. Each of the chip parts is disposed on a stage of the chip tester and brought into contact with a probe head of the chip tester such that pad-electrodes of the chip are made in contact with a plurality of pin-electrodes of the probe head and test signals are supplied through the probe head to the chip, thereby conventional electrical tests and dynamic performance tests being performed. Bare chips without packaging are more popularly used for multi-chip modules (MCM) in recent years, and this trend necessitates a chip tester with features of high handling efficiency and measurement precision.

2. Description of the Related Art

An exemplary chip tester of the prior art is shown in FIG. 1 which shows a schematic side view of the chip tester. A frame 10 is arranged on a main table 5 of the chip tester. The frame 10 comprises a plate 10a which is movable vertically with aids of support guides 10b and a vertical drive mechanism 4 comprising a shaft 12a and an air cylinder 12. On a bottom surface of the plate 10a, an X-Y stage 6 is arranged on an X-table 7 and a Y-table 8 which are movable in a horizontal plane, i.e., in an X-direction and in a Y-direction respectively, and can be rotated in a θ direction. A suction chuck (not shown) is provided on a surface of the X-Y stage 6, which holds a semiconductor chip 1 for test, thereby a chip surface with pad-electrodes looking downward.

An ITV camera 15 looking upward is arranged on a left side of the main table 5 and an image of the chip surface can be viewed on a screen of a monitor (not shown). Chip position on the X-Y stage 6 is adjusted to a specified position by respective drive mechanisms attached to the X-table 7 and Y-table 8. Thereafter, the frame 10 with the semiconductor chip 1 is subjected to a translational movement to a right side of the main table 5 (to a position shown by dashed lines) by a drive mechanism comprising a drive motor unit 40, a drive shaft 41 and a bearing unit 42. The chip surface on the X-Y stage 6 is thereby moved so as to position just above a probe head 20 which is arranged on the main table 5. The plate 10a is lowered by the vertical drive mechanism 4 so that pin-electrodes of the probe head 20 contact with the pad-electrodes of the chip 1. Test signals from a signal source 17 are supplied to the probe head 20 and the chip 1 is tested for a variety of tests.

The tester of the prior art as described above requires precise position alignment of the pad-electrodes of the chip with the pin-electrodes of the probe head 20. Therefore, correct position adjustment of the X-Y stage 6 using the X-table 7 and the Y-table 8 and correct control of the translational movement of the frame 10 are required such that each chip 1 is moved just above the probe head 20.

Another idea of alignment between a chip and a substrate is disclosed in Japanese laid-open Patent Publication Hei-2-244649, which idea is schematically shown in FIG. 2. FIG. 2 shows a schematic view comprising an optical head 44, a monitor 16 and a control system (not shown). The optical head 44 is inserted between the chip 1 and the probe head 20. The optical head 44 can pick-up and transmit both images of the pad-electrodes and the pin-electrodes to a monitor 16 through a fiber cable, and the images can be displayed on a screen 16a of the monitor.

FIG. 3 shows images on the screen 16a. On a left side of FIG. 3, the images of the pad-electrodes 101 of the chip 1 and the pin-electrodes 21 of the prove head 20 are separately illustrated. On the actual screen 16a of the monitor 16, a composite image of these two images is displayed. The chip position on the X-Y stage 6 is adjusted by the drive mechanisms of such as of X-table and Y-table in the X- and Y-directions such that positions of the pad electrodes 101 of chip 1 are coincident with those of the pin-electrodes 21 of probe head 20 as shown on a right side of FIG. 3. Thereafter, the optical head 44 is removed aside, and the X-Y stage 6 is lowered so that the pin-electrodes 21 are in contact with the pad-electrodes 101.

The chip tester of the prior art shown in FIG. 1 includes a problem that the translational movement of the frame 10 in which the chip 1 is arranged is liable to cause a positional error and each chip needs a fine position adjustment, which reduce a work efficiency of the test steps. Further, if anyone of pin-electrodes 21 includes a position shift, a tip of the pin-electrode strikes on an edge of the pad-electrode 101 giving a defect to the pad-electrode.

The chip tester of FIG. 2 includes the optical head 44 and an associated control system which are expensive, and the handling thereof is complicated.

Another factor related with the chip tester is a structure of the prove head. FIG. 4 shows an exemplary structure of the prior probe head 20 partly in cross section. The probe head 20 comprises a circular disk 201 of an insulation material having a center hole 202. A plurality of pads 203 are formed at regular intervals on a peripheral portion on a bottom surface of the circular disk 201. A pin guide 204 composed of parts 204a, 204b, 204c is arranged on the disk 201, each pin-electrode 21, one end of which is connected to each one of pads 203, is so arranged to penetrate through the center hole 202 and through each respective hole 205 of the pin guide part 204a. A pin electrode 21 is firmly fixed to the part 204c so that a projection length from a surface of the part 204c is a specified height H. The height H is so determined as to allow some bend of a vertical portion of the pin-electrode 21 and to obtain a pressed-contact when contacts between the pad-electrodes 101 and tips of the pin-electrodes 21 are formed.

When the chip tester and the probe head 20 as described above are used for tests, the pad-electrode 101 is sometimes damaged when the alignment is not accurate so that the tip of the pin-electrode strikes an edge of the pad-electrode 101. Further in a dynamic test, especially in a high frequency test, the test can not avoid an effect of reflection caused by an impedance mismatch at the probe head 20, resulting In deteriorating precision of the test.

SUMMARY OF THE INVENTION

It is a general object of the invention, therefore, to provide a chip tester, wherein a chip for test is easily disposed on a stage at a position such that the chip is aligned with a prove head, resulting in improving a handling efficiency.

It is another object of the invention to provide the chip tester, wherein alignment precision is remarkably improved.

It is further object of the invention to provide a prove head of the chip tester, which has an improved characteristic for a high frequency test of the chip.

Foregoing and related objects are accomplished by the chip tester of the present invention. The chip tester comprises a stage on which a chip is disposed, a reversing mechanism comprising an arm and a shaft which moves the stage from a first position to a second position and reverses a surface of the stage so as to look from upward to downward, and vice versa, a vertical drive mechanism which moves the reversing mechanism vertically, and a probe head having pin-electrodes arranged under the stage while the arm is at the second position, thereby the chip surface looking downward.

The chip tester of the invention further comprises an auxiliary system for assisting alignment steps of the chip with the probe head, the auxiliary system comprising an image pickup device arranged above the stage at the fist position for picking up an image of the chip surface, and a monitor and a controller, these being operatively coupled with each other.

The chip tester of the invention further comprises an improvement in a chip guide for easy and precise positioning of each chip onto the stage and an improvement in the prove head for enhancing precision of a high frequency test of the chip.

Details of other modifications will become clear from a reading of the detailed description of the invention with reference to the drawings.

BRIEF DESCRIPTION OF THE DRAWINGS

Throughout the drawings, the same reference numerals designate and identify the same or the similar parts.

DETAILED DESCRIPTION OF THE PREFERRED EMBODIMENTS

Figure 5:
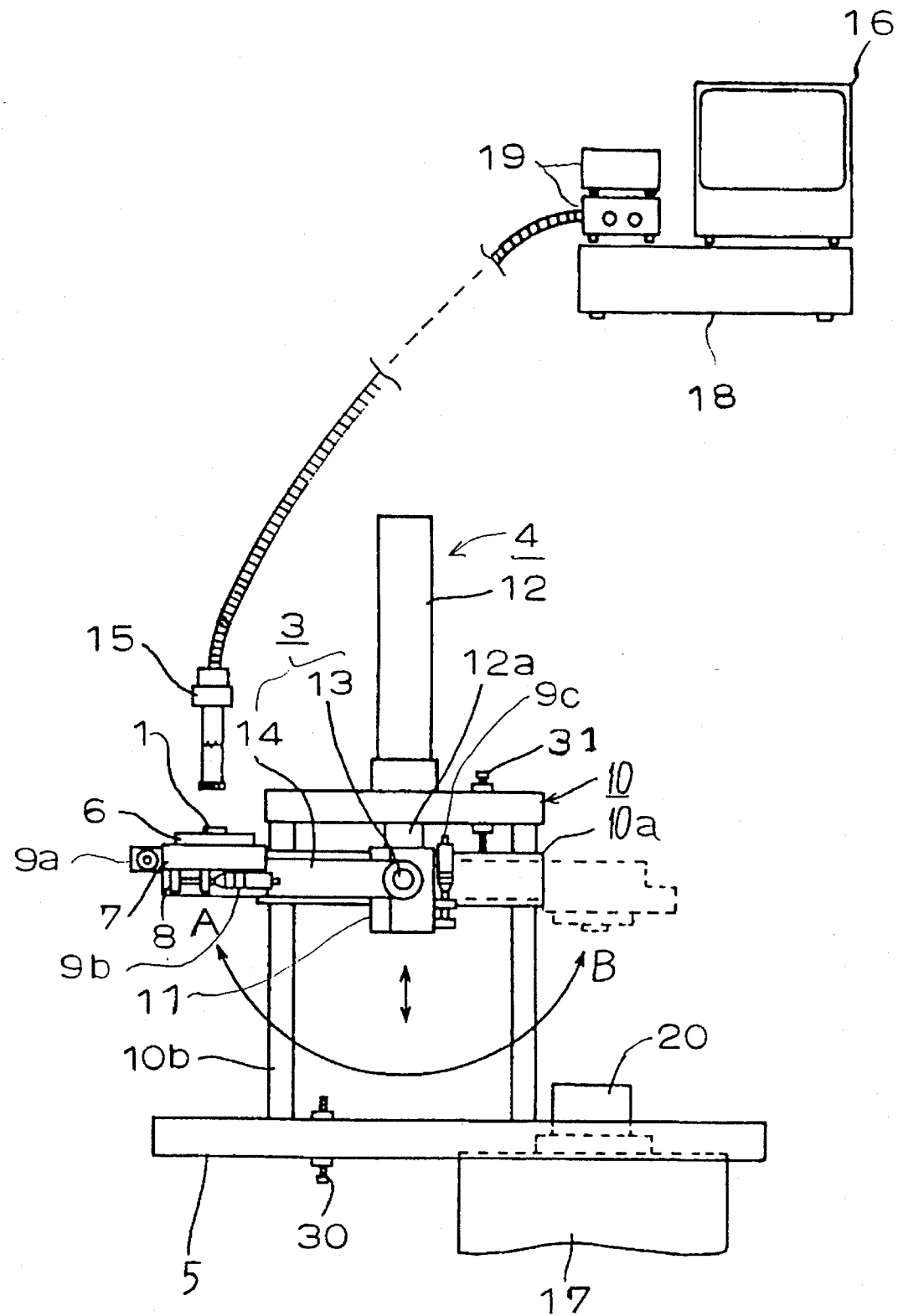
FIG. 5 shows a schematic side view of a chip tester in accordance with the present invention.

FIG. 5 shows a schematic side view of a chip tester in accordance with the present invention.

A frame 10 is arranged on a main table 5 of the chip tester. The frame 10 comprises a drive plate 10a which is movable vertically (in a Z-direction) with aids of support guides 10b. A Z-stage 11 is attached to a vertical drive mechanism 4 which comprises an air cylinder 12 and a shaft 12a, and the drive plate 10a is fixed to the Z-stage 11. Therefore, the drive plate 10a can be driven vertically by the vertical drive mechanism 4 and its Z-position can be precisely adjusted by a micrometer 9c attached to the Z-stage 11.

A reversing mechanism 3 is attached to the drive plate 10a and comprises a shaft 13 and a reversal arm 14. An end of the reversal arm 14 is rotatably engaged with the shaft 13 which is fixed to the drive plate 10a. The reversal arm 14 is arranged so as to rotate by 180° back and forth between two horizontal positions.

On the other end of the reversal arm 14, an X-Y stage 6 is arranged comprising an X-table 7 and a Y-table 8, and movable in a horizontal plane, i.e., in an X-direction and in a Y-direction respectively, and the X-Y stage 6 comprises also an adjustment mechanism for an angular position by rotating the X-Y stage 6 in a θ direction. Micrometers 9a, 9b are provided with the X-table 7 and Y-table 8 respectively and the micrometers control the movement of the X-Y stage 6 in X-direction and Y-direction. A suction chuck is provided on a surface of the X-Y stage 6, which holds a semiconductor chip 1 for the test. When the reversal arm 14 is in a first position A (on the left side of FIG. 5), a chip 1 is disposed such that a chip surface with pad-electrodes looks upward.

An ITV camera 15 looking downward is arranged on a left side of the frame 10 so as to pickup an image of the chip surface which can be viewed on a screen of a monitor. A probe head 20 is provided on the main table 5 on a right side of the frame 10. Position of the probe head 20 is so arranged that when the reversal arm 14 rotates by 180° to a second position B as shown by an arrow, the chip surface is positioned right above the probe head 20 as to face pin-electrodes of the probe head 20. When the drive plate 10a is lowered by the vertical drive mechanism 4 so that pin-electrodes of the probe lead 20 contact with the pad-electrodes of the chip 1, the chip 1 is ready for being supplied with test signals from a signal source 17 through the probe head 20 and tested for a variety of tests.

Other particular features of the chip tester of the present invention are next described. The frame 10 comprises a lower stopper 30 and an upper stopper 31 for restricting the movement of the drive plate 10a in the Z-direction. A chip guide 50 (not shown in FIG. 5) is provided on the X-Y stage 6, which has an "L"-character shape and has a function of easy and precise positioning of a chip for the test. The details of the chip guide is described separately.

The chip tester of the invention further comprises an monitor system and an optical system including the ITV camera 15. The monitor system comprises a main controller 18 for the monitor 16 and an auxiliary controller 19 for the ITV camera 15. The camera 15 comprises a zoom lens. The main and auxiliary controllers 18, 19 are operatively coupled with ITV camera 15 and the monitor 16, and the controllers have functions of generating signals of horizontal and vertical cursor lines on a screen of the monitor 16 and displaying an image of an object on the X-Y stage 6 and these cursor lines, thereby the cursor lines being superposed on the image and position of each of the cursor lines being adjustable by the main controller 18.

Figure 1:
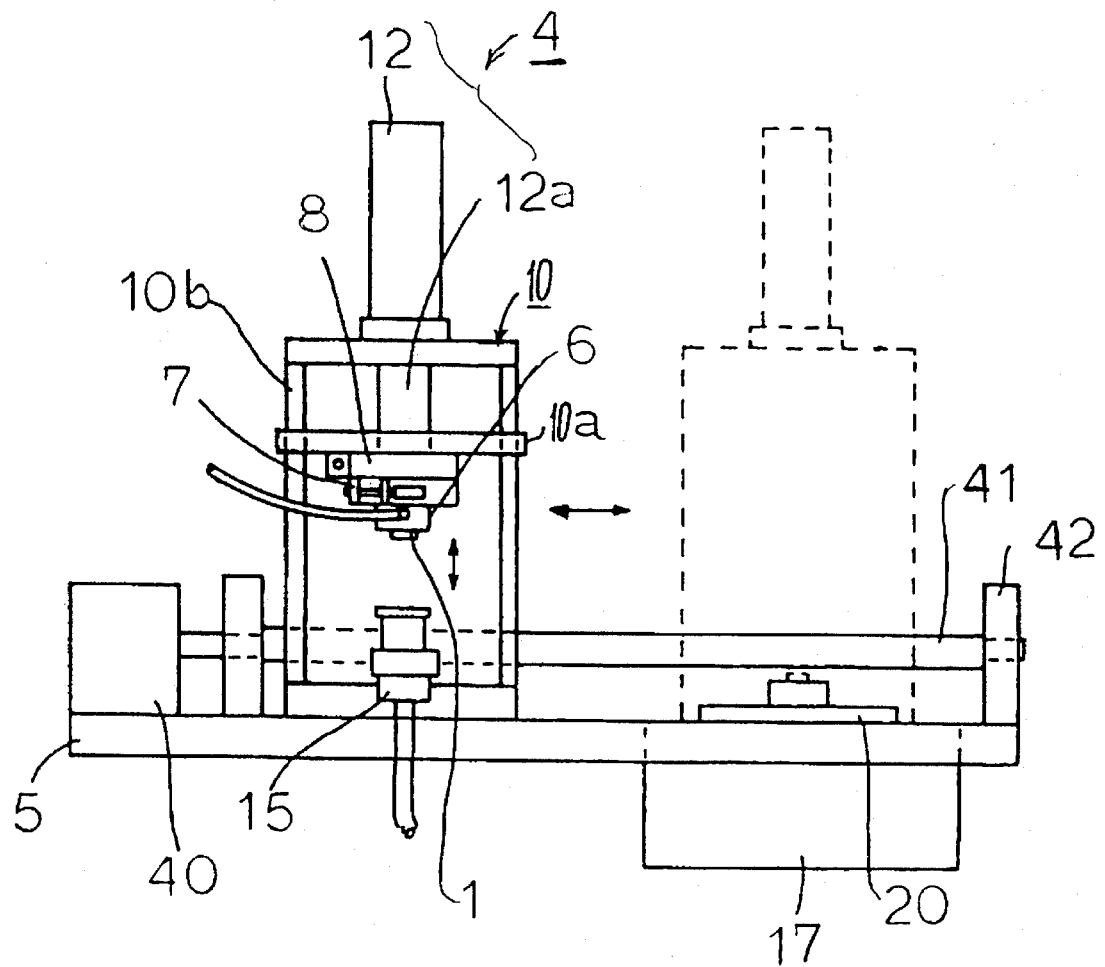
FIG. 1 is a schematic side view of an exemplary chip tester of the prior art.
Figure 2:
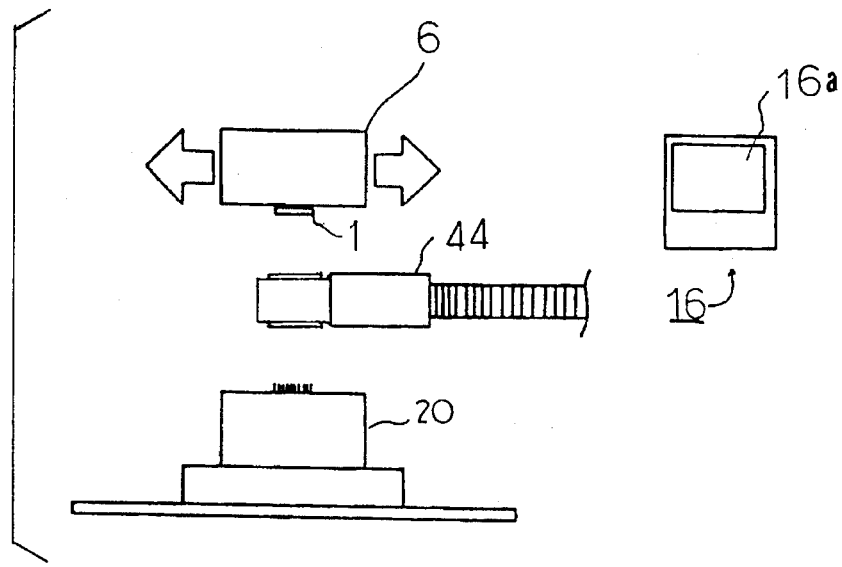
FIG. 2 is a schematic side view for a purpose of explaining a fine adjustment method of the prior art using an optical head which is inserted between a chip and a probe head and picks up a composite image of pad-electrodes of the chip and pin-electrodes of the probe head.
Figure 3:
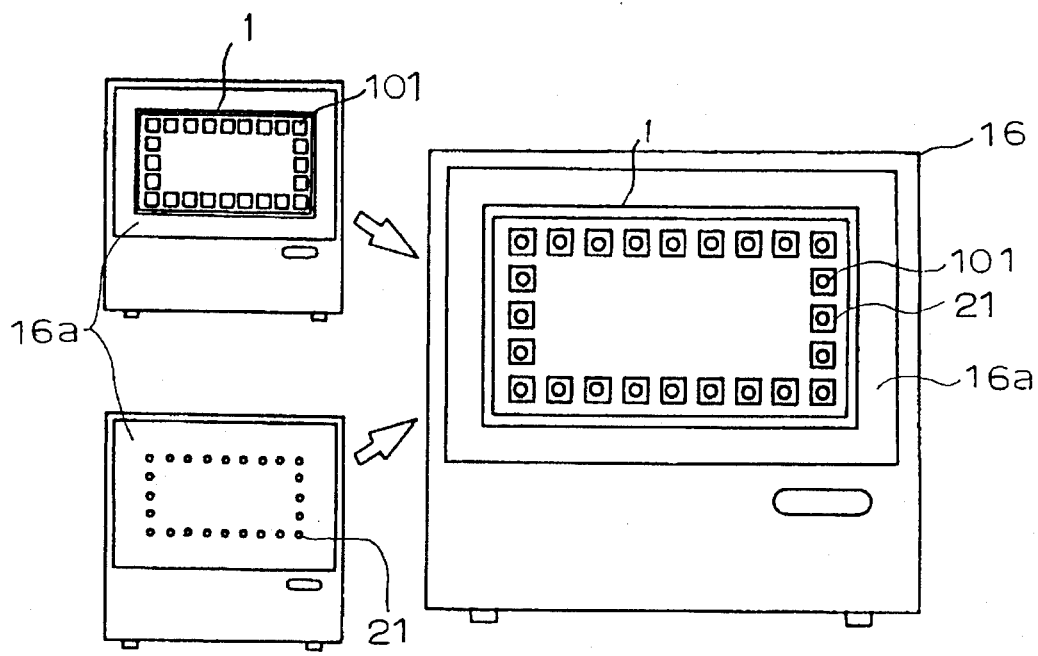
FIG. 3 shows images on a monitor screen using the system illustrated in FIG. 2, wherein on a left side in FIG. 3, images of pad-electrodes of the chip and pin-electrodes of the prove head are separately illustrated, and on a right side two images are superposed and illustrated.
Figure 4:
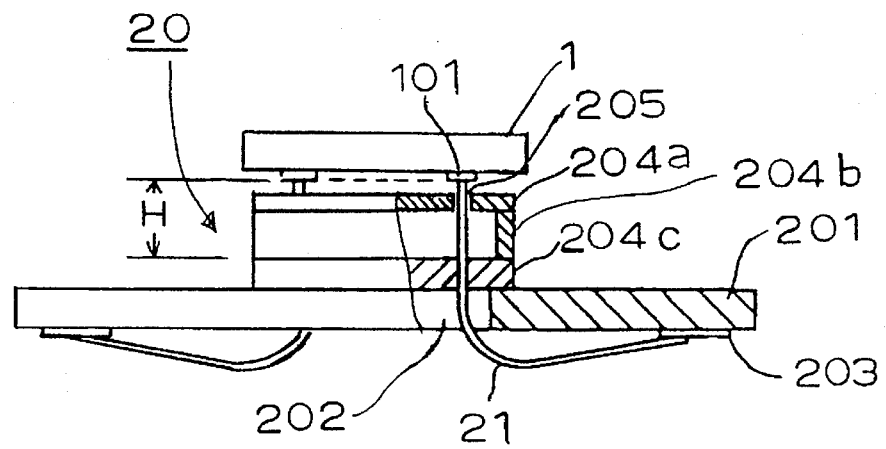
FIG. 4 shows an exemplary structure of a probe head of the prior art.
Figure 6:
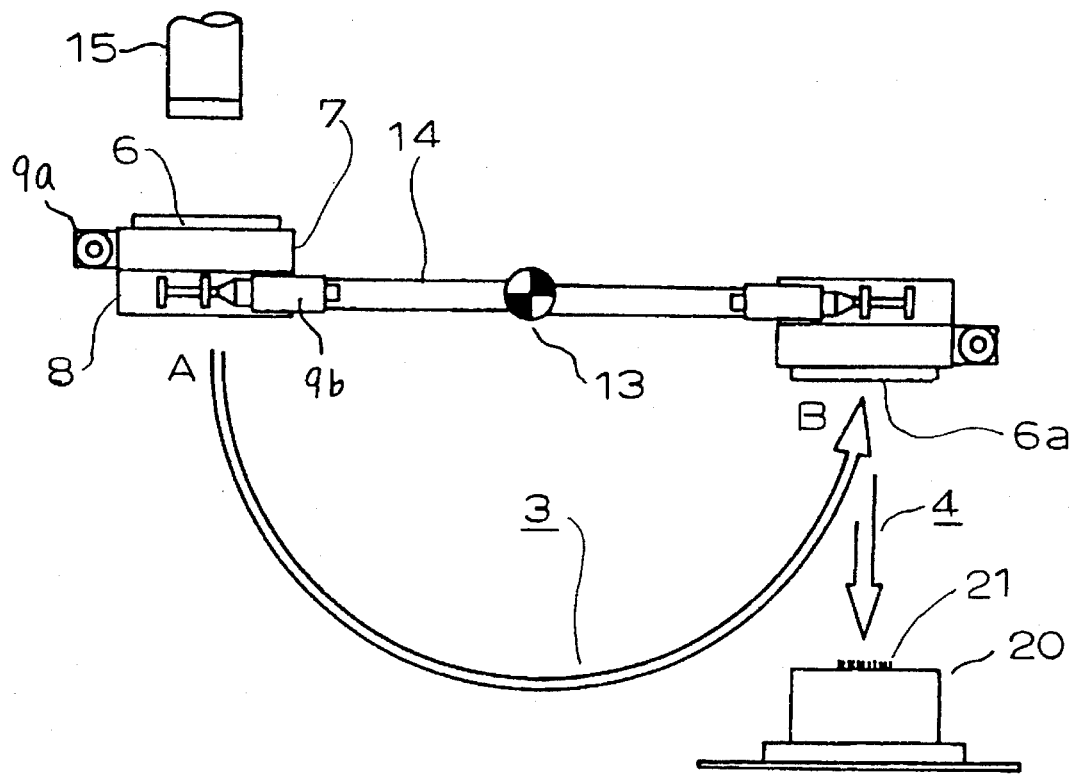
FIG. 6 shows movements of a stage schematically using a reversing mechanism of the present invention, thereby only the reversing mechanism, an X-Y stage and a probe head being taken out and illustrated for easy understanding.

Next, a handling method and operation of the chip tester of the present invention are described First, the reversal arm 14 in FIG. 5 is turned over from the first position A to the second position B thereby no chip being disposed on the X-Y stage 6. In FIG. 6, only the reversal mechanism 3, the X-Y stage 6 and the probe head 20 are taken out, and relative positions before and after the rotation of the reversal arm 14 are illustrated with respect to the probe head 20. The reversal arm 14 thereafter is lowered by the vertical drive mechanism 4 so that a surface 6a of the X-Y stage 6 just touch tips of the pin-electrodes 21. In FIG. 5, stop position of the lower stopper 30 is temporary set at this contact point, thereby position of the Z-stage 11 being set in advance such that the micrometer 9c for the fine adjustment of the Z-stage 11 indicates a reference value such as "zero".

Figure 7A:
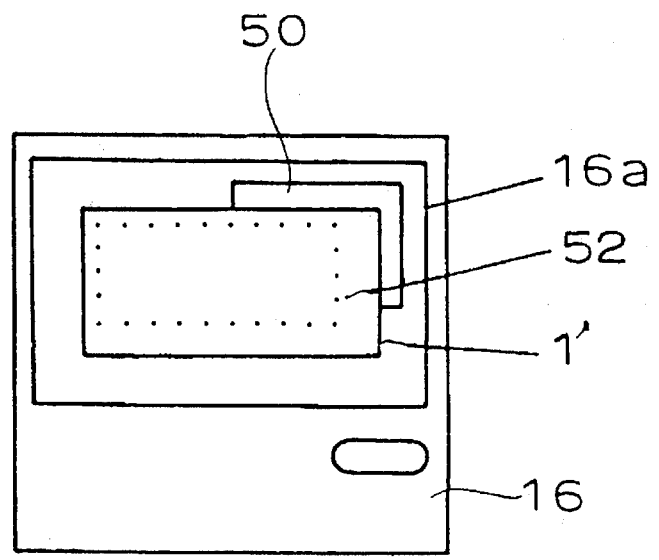
FIGS. 7A through 7E show images on a monitor screen, wherein the images during alignment steps are sequentially shown using the chip tester of the present invention.

The reversal arm 14 is once returned to the first position A. A dummy chip 1' is disposed on the X-Y stage 6 and fixed thereto by the suction chuck so that two adjacent sides of the dummy chip 1' closely contact with inner sides of the "L"-character shape of the chip guide 50. The arrangement can be monitored on a screen 16a of the monitor 16 as shown in FIG. 7A (at this moment, no flaw marks 52 can be observed). Position of the X-Y stage 6 is adjusted by the micrometers 9a, 9b such that when the reversal arm 14 is turned over, the center of the dummy chip 1' is roughly coincident with the center of the probe head 20.

Further, the micrometer 9c is to be adjusted by an amount equivalent to a thickness of the dummy chip 1' so that the tips of the pin-electrodes 21 of the probe head 20 are just in contact with a surface of the dummy chip 1' when the vertical drive mechanism 4 drives the reversal arm 14 downward. In case that the micrometer 9c has been set to indicate zero at the initial setting, then the micrometer 9c is adjusted this time to indicate a value of the thickness of the dummy chip 1' for example, 0.5 mm. This would result in making the surface of the dummy chip 1' just contact with the tips of the pin-electrodes 21. However, with a purpose of obtaining precise alignment of positions of chip with the probe head 20, the positions of pin-electrodes 21 of the probe head 20 are to be marked onto the dummy chip 1'. Flaw marks 52 can be formed on the dummy chip 1' by adjusting the micrometer 9c as to indicate a value which is a little smaller than the above thickness indication of the dummy chip 1'.

Figure 7B:
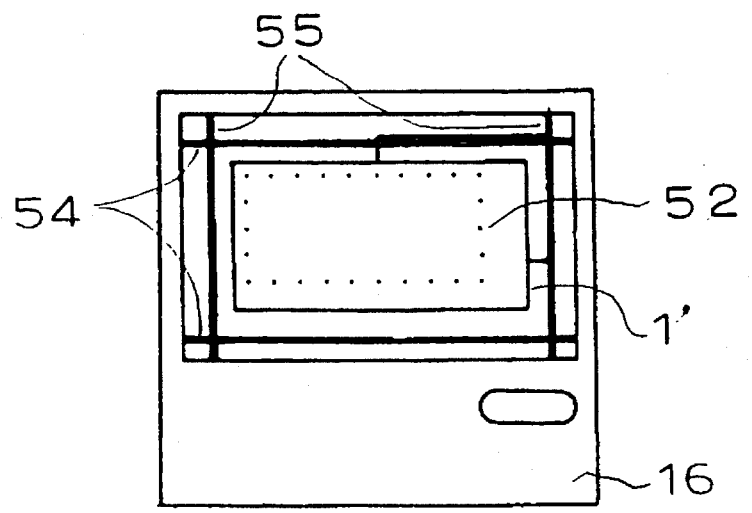
Figure 7C:
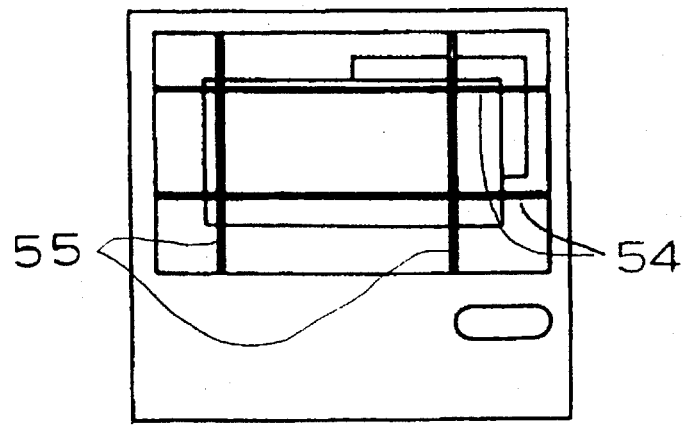

When the above preparations are finished, the reversal arm 14 with the dummy chip 1' on the X-Y stage 6 is once again turned, to the second position B (in FIGS. 5, 6) and lowered by the vertical drive mechanism 4, thereby flaw marks 52 being formed on the dummy chip 1'. When the reversal arm 14 is returned back to the position A, the monitor 16 shows an image of the flaw marks 52 as shown in FIG. 7A. The main controller 18 for the monitor 16 is controlled sn as to generate two horizontal cursor lines 54 and two vertical cursor lines 55, which are observed on the monitor 16 as shown in FIG. 7B. These horizontal and vertical cursor lines are adjusted by the main controller 18 so as to be coincident with respective flaw mark lines as shown in FIG. 7C.

Two horizontal and two vertical cursor lines are not always needed for this purpose, single horizontal sensor line and single vertical cursor line can achieve this purpose.

Figure 7D:
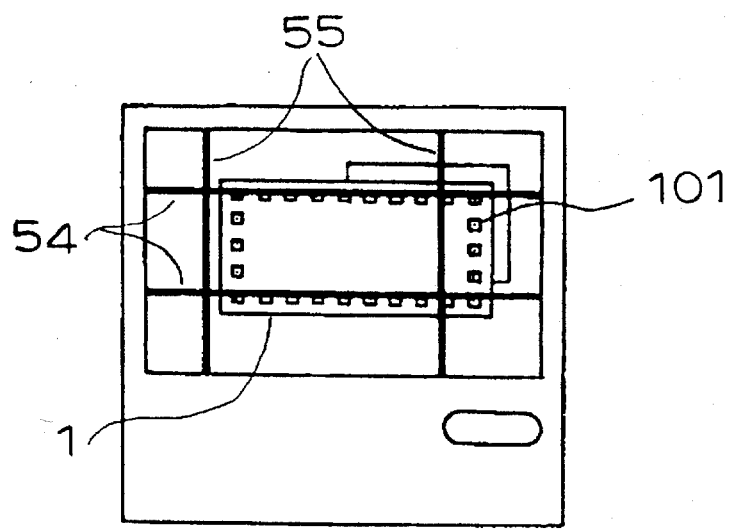

The dummy chip 1' is removed from the X-Y stage 6, and a chip for the test is disposed thereon, thereby two adjacent sides of the chip 1 being pressed against the chip guide 50. An image of a surface with pad-electrodes 101 and the horizontal and vertical cursor lines 54, 55 which have been previously set up are shown on the monitor as shown in FIG. 7D. There can be seen discrepancies between rectangular-shaped positions of the pad-electrodes 101 and the respective cursor lines 54, 55 forming a rectangle.

Figure 7E:
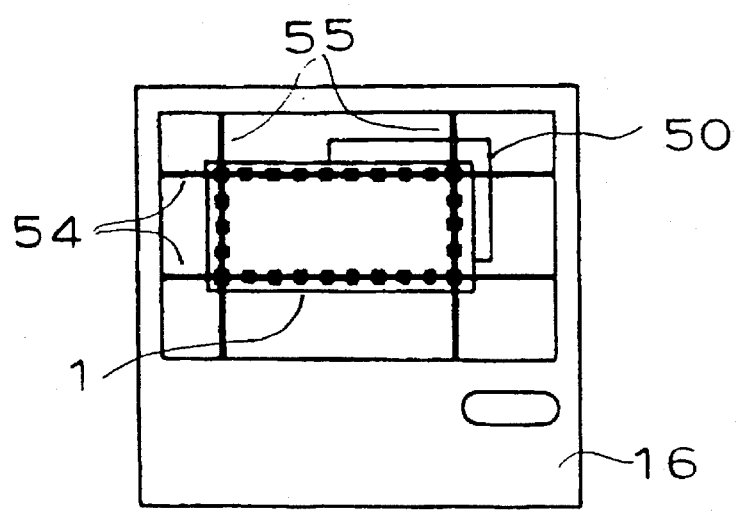

Position of the X-Y stage 6 is adjusted by controlling the micrometers 9a, 9b and the angular position adjuster such that the center lines of rectangular-shaped pad-electrodes are coincident with the respective cursor lines 54, 55. The coincidence is confirmed by observing the image on the screen 16a as shown in FIG. 7E. When single horizontal cursor line and single vertical cursor line are used, the lower horizontal cursor line and the left vertical cursor line in FIG. 7E are aligned with the respective lines of the pad-electrodes.

After the alignment steps, the reversal arm 14 is turned to the second position B and the X-Y stage 6 is lowered until the pin-electrodes 21 of the probe head 20 touch the pad-electrodes 101 of the chip 1, thereby some bend of the pin-electrodes being allowable for obtaining sure press-contacts between the pad-electrodes 101 and the tips of pin-electrodes 21. Position of the lower stopper 30 is again adjusted and fixed so as to easily position the X-Y stage 6 by the vertical drive mechanism 4, and the micrometer 9c is also adjusted at this position so as to indicate "zero".

The above steps require time in some degree as an initial adjustment steps. However, when the steps for the initial adjustment is finished, alignment step for a second chip for test becomes remarkably simple. Namely, when the second chip is disposed on the X-Y table 6 in a manner that two adjacent sides of the chip 1 are pressed against the chip guide 50, the chip 1 can be quickly brought to the electrical test condition using the reversal mechanism 3 and the vertical drive mechanism 4.

Figure 8A:
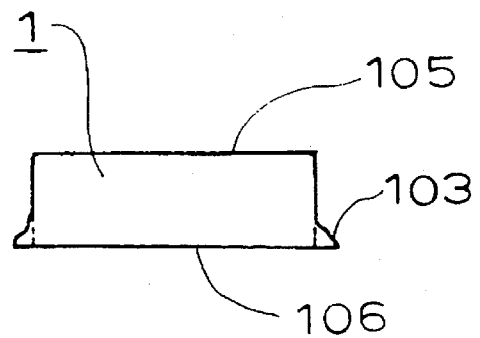
FIGS. 8A through 8C show cross sections of a chip, a chip guide of the present invention, and a combination of these two respectively.
Figure 8B:
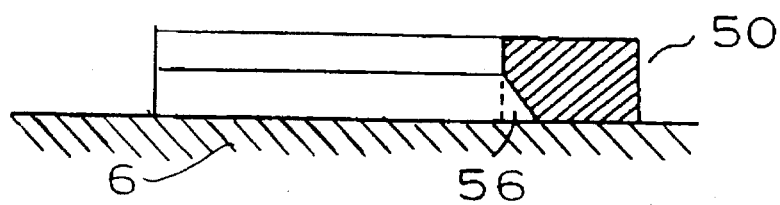
Figure 8C:
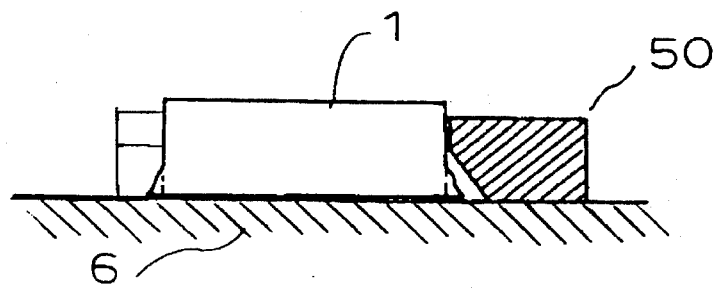

In semiconductor production, when a semiconductor wafer finished wafer processes, the wafer is subjected to a scribing step for cutting the wafer into a plurality of chips. The cut-off chips usually form scribing remnant 103 around a periphery of the chip 1 after the scribing step. This is shown in FIG. 8A. The remnants generally remain on a minor surface side 106 of the chip (active elements and pad-electrodes are formed on a major surface side 105 of the chip 1). Therefore, the chip guide 50 fixed on the X-Y stage 6 and having "L"-character shape is worked such that edge portions 56 which face and contact with the stage 6 and the chip 1 are chipped off. The chip-off shape is shown, partly in cross section, in FIG. 8B. Dimensions of the chip-off size of the chip guide 50 are determined to have enough size to accept the estimated largest size of the remnant. In FIG. 8C, when the chip 1 for the test is disposed on the X-Y stage 6 and pressed against the chip guide 50, the chip is precisely arranged at an expected position on the X-Y stage 6.

Figure 9:
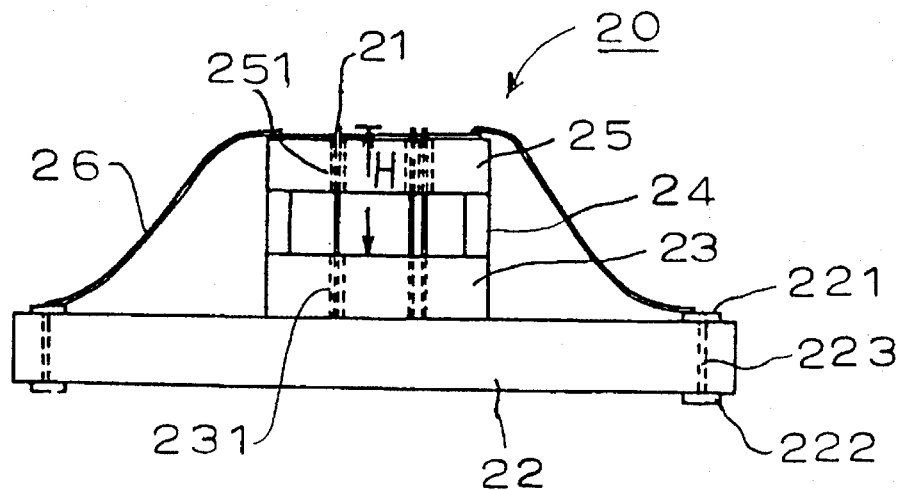
FIG. 9 shows a schematic side view of the probe head of the present invention.

FIG. 9 is a schematic side view of the probe head 20 of the present invention. The structure of FIG. 9 is quite schematic only showing a basic structure such that the probe head 20 is composed of a base plate 22, a support plate 23, an intermediate support 24, and a guide plate 25, and these parts are stacked in this order and fixed together. In an actual probe head, an insulation material such as epoxy resin is used for a main portion of the base plate 22 and guide plate 25 and is buried in a ring-shaped part. Pin-electrodes 21, each having a diameter of about 80 μm and made of conductive material such as gold alloy, tungsten, and copper alloy are inserted through guide holes 251 formed in the guide plate 25 and further into holes 231 formed in the support plate 23, thereby ends of the pin-electrodes being firmly fixed to the resin material forming the holes 231. A length from a tip of the pin-electrode 21 to a top surface of the support plate 23 is so arranged as to have a specified length H. An exemplary value or H is selected as 20 mm. It is desirable that the pin-electrode 21 projects beyond the top surface of the guide plate 25 by about 200 μm.

On a top surface and a bottom surface of the base plate 22, which is made of such as PCB material, a plurality of pads 221 and 222 are formed in peripheral portions of the top and bottom surfaces respectively. Numbers of the pads 221 and 222 are equal and each position of the pads 221 on the top surface corresponds with respective position of the pads 222 on the bottom surface. Two pads 221 and 222 are connected by a conductive material burying a via-hole 223 formed between the two pads.

Figure 10A:
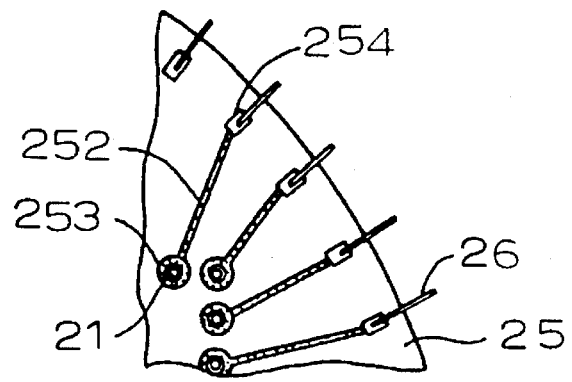
FIG. 10A and 10B show respective partial top and bottom views of a guide plate of the probe head of the present invention.
Figure 10B:
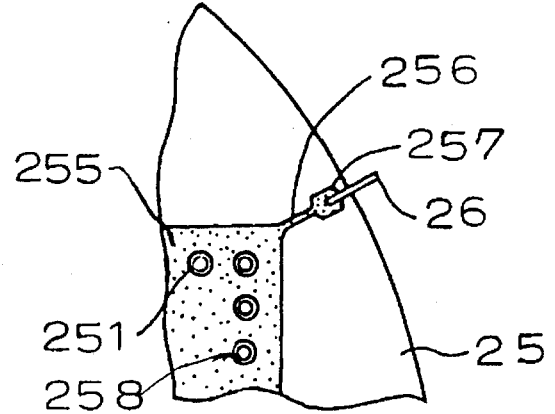

A top view and a bottom view of the guide plate 25 are partly shown in FIGS. 10A and 10B respectively. On the top surface of the guide plate 25, a plurality of pattern sets are formed, each set comprising a relay pad 254, a contact pad 253 and a wiring pattern 252. The contact pad 253 has a ring shape having a hole, which each pin-electrode 21 penetrates through, thereby an electrical contact being formed between the pin-electrode 21 and the contact pad 253. The contact pad 253 is connected to the relay pad 254 via the wiring pattern 252, and the relay pad 254 is further connected to the pad 221 on the base plate 22 with a conductive wire 26.

On the bottom surface of the guide plate 25, an auxiliary electrode 255 is formed, which is made of a large conductive pattern and has an enough size covering an entire surface of the chip. The auxiliary electrode 255 has a plurality of circular void portions (holes) 258 around the guide holes 251 of the guide plate 25 so as to avoid contact between the auxiliary electrode 255 and the pin-electrodes 21. The auxiliary electrode 255 is connected to a relay pad 257 via a wiring pattern 256 formed on the bottom surface of the guide plate 25. One end of a connecting wire 26 is bonded to the relay pad 257, and the other end of the wire 26 is connected to one of pads 221 on the base plate 22. If the pad 221 connected to the auxiliary electrode 255 is used as a around terminal, the auxiliary electrode 255 effectively works as a shield electrode.

The surfaces on which the auxiliary electrode 255 and the contact pads 253 are respectively formed may be reversed. Namely, the auxiliary electrode 255 is formed on the top surface of the guide plate 25 and the contact pads 253 are formed on the bottom surface thereof.

Figure 11A:
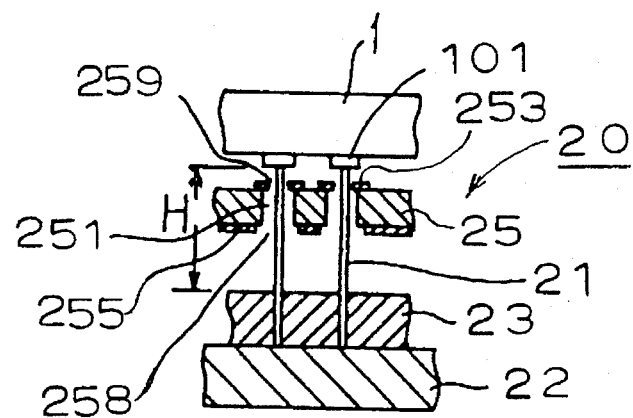
FIGS. 11A and 11B show a cross section of the probe head of the present invention and the chip, when pad-electrodes of the chip is brought into contact with the pin-electrodes of the probe head, wherein a contact pad in FIG. 11A formed on the guide plate protrudes inwardly and contacts with the pin-electrode, and the contact pad in FIG. 11B has a cylindrical portion which is formed in a guide hole and contacts with the pin-electrode.

FIG. 11A shows a partial cross section of the probe head 20 and the chip 1 when the pad-electrodes 101 of the chip 1 is brought into contact with the pin-electrodes 21 of the probe head 20. As shown in FIG. 11A, a diameter of a hole 258 formed in the auxiliary electrode 255 is larger than that of the guide hole 251 of the guide plate 25. On the other hand, a diameter of a hole 259 formed in the contact pad 253 is smaller than that of the guide hole 251 of the guide plate 25. Since an inside edge of the hole 259 protrudes inwardly on the guide hole 251 and easily contacts with the pin-electrode 21 when the pad-electrode 101 presses the tip of the pin-electrode 21 downward.

Figure 11B:
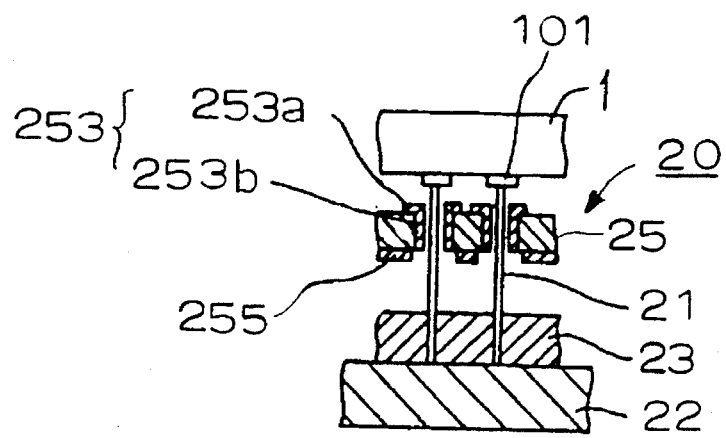

FIG. 11B shows a similar cross section as FIG. 11A, however, there is only one difference that the contact pad 253 comprises a cylindrical portion 253b other than a planar portion 253a. The cylindrical portion 253b is formed on an inner wall of the guide hole 251, and both cylindrical and planar portions 253a, 253b are formed simultaneously by a deposition method of conductive material. By application of this structure, contact reliability between the pin-electrode 21 and the contact pad 253 is remarkably enhanced.

The probe head 20 of the present invention makes it possible to install electronic parts such as condensers around the guide plate 25 using the wiring patterns 252, 256 and the auxiliary electrode 255. In a high frequency signal test, impedance-matching for a test signal can be easily obtained, which reduces reflection and enhances test precision.

The present invention may be embodied in other specific forms different from the above disclosed embodiments. The presently disclosed embodiments are, therefore, to be considered in all respects as illustrative and not restrictive, the scope of the invention being indicated by the appended claims, rather than the foregoing description, and all changes which come within the meaning and range of equivalence of the claims are, therefore, to be embraced therein.

What is claimed is:

1. A chip tester for electrically testing a chip having pad-electrodes on a chip surface, comprising:

a stage on which a chip for test is disposed, and which position is adjustable in horizontal directions, reversing means for reversing a surface of said stage from a first position of looking upward to a second position of looking downward and vice versa, the reversing means comprising an arm and a shaft, said stage being attached to one end of the arm, the other end of the arm being engaged with the shaft, thereby a chip surface on the stage being reversed by rotation of said arm from looking upward to looking downward and vice versa, vertical drive means for moving said shaft vertically, and a probe head comprising pin-electrodes positioned under said stage at the second position, tips of the pin-electrodes being arranged to face said stage, and whereby the chip for test is loaded on said stage at the first position and its horizontal position is adjusted, the arm of said reversing means is rotated to the second position, said reversing means is lowered by said vertical drive means so that said pad-electrodes of the chip are brought in contact with said pin-electrodes of the probe head for test.

2. The chip tester as recited in claim 1, wherein said chip tester further comprises a chip guide fixed on said stage, the chip guide having a function of positioning the chip at a specified position on said stage.

3. The chip tester as recited in claim 2, wherein the chip tester further comprises:

an image pickup device arranged above said stage at the first position for picking up an image of an object on the stage, monitor coupled with said pickup device, and a controller operatively coupled with said monitor, and having a function of generating cursor lines on a screen of said monitor superposed on said image of the object, position of each of the cursor lines being adjustable by the controller.

4. The chip tester as recited in claim 3, wherein said pad-electrodes or the chip and said pin-electrodes of the probe head are arranged in a rectangular shape, and said cursor lines comprise two horizontal cursor lines and two vertical cursor lines, and whereby these cursor lines are adjusted to correspond to the respective lines of the rectangular-shaped positions of the pin-electrodes and used for positioning the chip on the stage.

5. The chip tester as recited in claim 2, wherein said chip guide comprises two adjacent sides which form a corner and accept corresponding two adjacent sides of the chip when the chip is disposed on the stage and pressed against the chip guide.

6. The chip tester as recited in claim 5, wherein said chip guide has undercut portions along edges of said two adjacent sides and on contacting sides with said stage, whereby scribing remnant attached to a periphery of the chip on a minor surface side is received in the undercut portions and the chip side on a major surface side is accurately brought in contact with the chip guide.

7. The chip tester as recited in claim 1, wherein said chip tester further comprises a stopper for stopping said vertical drive means when the chip are brought in contact with said pin-electrodes of the probe head.

8. The chip tester as recited in claim 1, wherein said probe had comprises a guide plate on the tip side of the probe head, the guide plate comprising:

a plurality of guide holes through which each of said pin-electrodes penetrates, an auxiliary electrode formed on a surface of said guide plate, the auxiliary electrode having an area at least covering an entire area formed by the plurality of said pin-electrodes, a plurality of contact pads formed on another surface of said guide plate and allowing contact with respective each of said pin-electrodes, and lead-out means connected to said auxiliary electrode and each of said contact pads respectively.

9. The chip tester as recited in claim 8, wherein each wall of said guide holes is covered with a conductive layer, and each of said contact pads is integral with the conductive layer formed in the guide hole.

10. A method of testing a chip using the chip tester is recited in claim 3, the chip being aligned with the probe head, the method comprising the steps of:

(a) adjusting positions of said cursor lines on the screen of said monitor by said controller so as to be coincident with corresponding positions of selected lines of an arrangement of said pin-electrodes when said reversing means is moved to the second position, (b) disposing a chip on said stage when said reversing means locates at the first position, thereby the chip being pressed against said chip guide, and (c) adjusting position of said stage in the horizontal directions such that images of selected lines of an arrangement of said pad-electrodes on the monitor are coincident with said adjusted cursor lines.

11. The method as recited in claim 10, wherein said method further comprises the following steps of:

(d) moving said stage to the second position by said reversing means, (e) lowering said stage by said vertical drive means such that the pin-electrodes of said probe head are in contact with pad-electrodes of said chip, (f) electrically testing said chip, and (g) restoring said stage to the first position, and removing said chip.

12. The method as recited in claim 10, wherein, after said step (a) and said step (c) are once finished, alignments of subsequent chips for test are performed substantially by said step (b) alone.

13. The method as recited in claim 10, wherein said pin-electrodes and said pad-electrodes have arrangements of a rectangular-shape, and said cursor lines in step (a) comprise two horizontal cursor lines and two vertical cursor lines, and each of said cursor line is adjusted as to be coincident with the respective line of the rectangular-shape arrangement of the pin-electrodes, and said adjusting step (c) denotes that said stage is adjusted such that lines of the rectangular-shaped arrangement of the pad-electrodes are coincident with the respective cursor lines.

14. The method as recited in claim 10, wherein said adjusting step (a) further comprising the following substeps of:

(a-1) disposing a dummy chip on said stage when said reversing means locates at the first position, thereby the chip being pressed against said chip guide, (a-2) moving said stage to the second position by said reversing means, (a-3) lowering said stage by said vertical drive means such that marks of the pin-electrodes of said probe head are formed on said dummy chip, (a-4) restoring said stage to the first position, (a-5) adjusting position of said cursor lines on the screen so as to be coincident with respective selected lines of said marks, and (a-6) removing said dummy chip.

* * * * *